US 11,671,081 B2

(12) United States Patent
Bansal et al.

(10) Patent No.: US 11,671,081 B2
(45) Date of Patent: Jun. 6, 2023

(54) RAIL-TO-RAIL SOURCE FOLLOWER BUFFER FOR SWITCHING REGULATOR DRIVER SUPPLY

(71) Applicant: QUALCOMM Incorporated, San Diego, CA (US)

(72) Inventors: Mukesh Bansal, San Diego, CA (US); Iulian Mirea, San Diego, CA (US); Xun Liu, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 354 days.

(21) Appl. No.: 17/119,817

(22) Filed: Dec. 11, 2020

(65) Prior Publication Data

US 2021/0184661 A1  Jun. 17, 2021

Related U.S. Application Data

(60) Provisional application No. 62/947,722, filed on Dec. 13, 2019.

(51) Int. Cl.
*H02M 3/158* (2006.01)
*H03K 3/356* (2006.01)
*H02M 1/088* (2006.01)

(52) U.S. Cl.
CPC ...... *H03K 3/356017* (2013.01); *H02M 3/158* (2013.01); *H02M 1/088* (2013.01)

(58) Field of Classification Search
None
See application file for complete search history.

(56) References Cited

U.S. PATENT DOCUMENTS

| | | | | |
|---|---|---|---|---|
| 5,867,015 A | * | 2/1999 | Corsi | G05F 3/242 |
| | | | | 327/542 |
| 8,080,984 B1 | * | 12/2011 | Geynet | G05F 1/56 |
| | | | | 323/280 |
| 9,989,981 B1 | * | 6/2018 | Du | G05F 1/595 |
| 10,234,883 B1 | * | 3/2019 | Du | G05F 1/563 |
| 2003/0001550 A1 | * | 1/2003 | Pulkin | G05F 1/575 |
| | | | | 323/273 |
| 2017/0353188 A1 | * | 12/2017 | Saeki | H03F 3/301 |

FOREIGN PATENT DOCUMENTS

| | | | | | |
|---|---|---|---|---|---|
| CN | 103853222 | * | 8/2014 | | G05F 1/56 |
| DE | 112018006436 | * | 3/2022 | | G05F 1/563 |
| KR | 102336113 | * | 12/2021 | | G05F 1/575 |

* cited by examiner

*Primary Examiner* — Matthew V Nguyen
(74) *Attorney, Agent, or Firm* — Patterson + Sheridan, L.L.P.

(57) ABSTRACT

Certain aspects of the present disclosure are directed to a regulator. The regulator generally includes a source follower circuit and a low-voltage assist circuit. The low-voltage assist circuit generally includes a first transistor having a gate coupled to an output node of the source follower circuit, a voltage comparison circuit having a first input coupled to a source of the first transistor and a second input coupled to a control input node of the source follower circuit, and a second transistor having a gate coupled to an output of the voltage comparison circuit and a drain coupled to the output node of the source follower circuit.

21 Claims, 3 Drawing Sheets

RAIL-TO-RAIL SOURCE FOLLOWER BUFFER FOR SWITCHING REGULATOR DRIVER SUPPLY

CROSS-REFERENCE TO RELATED APPLICATION

This application claims benefit of and priority to U.S. Provisional Application No. 62/947,722, filed on Dec. 13, 2019, which is hereby assigned to the assignee hereof and hereby expressly incorporated by reference herein in its entirety as if fully set forth below and for all applicable purposes.

TECHNICAL FIELD

Certain aspects of the present disclosure generally relate to electronic circuits and, more particularly, to gate drive circuitry for a power stage.

BACKGROUND

As the minimum feature size of integrated circuits (ICs) continues to shrink and the desire for reduced power consumption persists, the core logic section of digital circuits is being supplied from ever-decreasing voltages, such as down to 1.0 V or lower. However, the power supply voltages of other sections of the IC may remain at higher voltage levels. Therefore, a voltage level shifter (e.g., level-shifting circuit) may be used to level shift a signal from a relatively low supply voltage to a relatively high supply voltage to drive transistors of a power stage. For example, the voltage level shifter may generate a voltage at an input of a driver for driving the gate of a transistor of the power stage.

SUMMARY

The systems, methods, and devices of the disclosure each have several aspects, no single one of which is solely responsible for its desirable attributes. Without limiting the scope of this disclosure as expressed by the claims that follow, some features will now be discussed briefly. After considering this discussion, and particularly after reading the section entitled "Detailed Description," one will understand how the features of this disclosure provide the advantages described herein.

Certain aspects of the present disclosure are directed to a regulator. The regulator generally includes a source follower circuit and a low-voltage assist circuit. The low-voltage assist circuit generally includes a first transistor having a gate coupled to an output node of the source follower circuit, a voltage comparison circuit having a first input coupled to a source of the first transistor and a second input coupled to a control input node of the source follower circuit, and a second transistor having a gate coupled to an output of the voltage comparison circuit and a drain coupled to the output node of the source follower circuit.

Certain aspects of the present disclosure are directed to a power stage. The power stage generally includes the regulator described herein, a third transistor, and a driver having an output coupled to a gate of the third transistor, wherein the output node of the regulator is coupled to a supply input of the driver.

Certain aspects of the present disclosure are directed to a method for voltage regulation. The method generally includes generating an output voltage via a source follower based on a control voltage at a control input node, generating a level-shifted version of the output voltage, comparing the control voltage and the level-shifted version of the output voltage, and adjusting the output voltage based on the comparison.

Certain aspects of the present disclosure are directed to an apparatus for voltage regulation. The apparatus generally includes means for generating an output voltage via a source follower based on a control voltage at a control input node, means for generating a voltage-level-shifted version of the output voltage, means for comparing the control voltage and the voltage-level-shifted version of the output voltage, and means for adjusting the output voltage based on the comparison.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure are generally directed to circuitry for rail-to-rail voltage regulation. For example, an output voltage of a regulator may not track a control voltage of the regulator below a certain control voltage threshold. Thus, the regulator may be implemented with a low voltage assist circuit having a voltage comparison circuit that detects a voltage difference between the control voltage and the output voltage of the regulator. The voltage comparison circuit may drive a transistor that pulls down the output voltage as the voltage difference increases. In other words, if the voltage comparison circuit detects that the output voltage is not tracking the control voltage of the regulator, the voltage comparison circuit drives the transistor to decrease the output voltage in an attempt for the output voltage to track the control voltage, as described in more detail herein.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

An Example Power Stage

A switching regulator power stage may include drivers that source and sink a relatively large amount of current to turn on and off power field-effect transistors (FETs). For example, each of the FETs of the power stage may have a large gate-to-source capacitance (Cgs) that may be charged and discharged to turn on and off the FET. Ideally, the supply voltage provided to drivers used to control the FETs should provide rail-to-rail voltage regulation and sink/source a large amount of current for fast settling of the gate voltages of the FETs.

Figure 1:
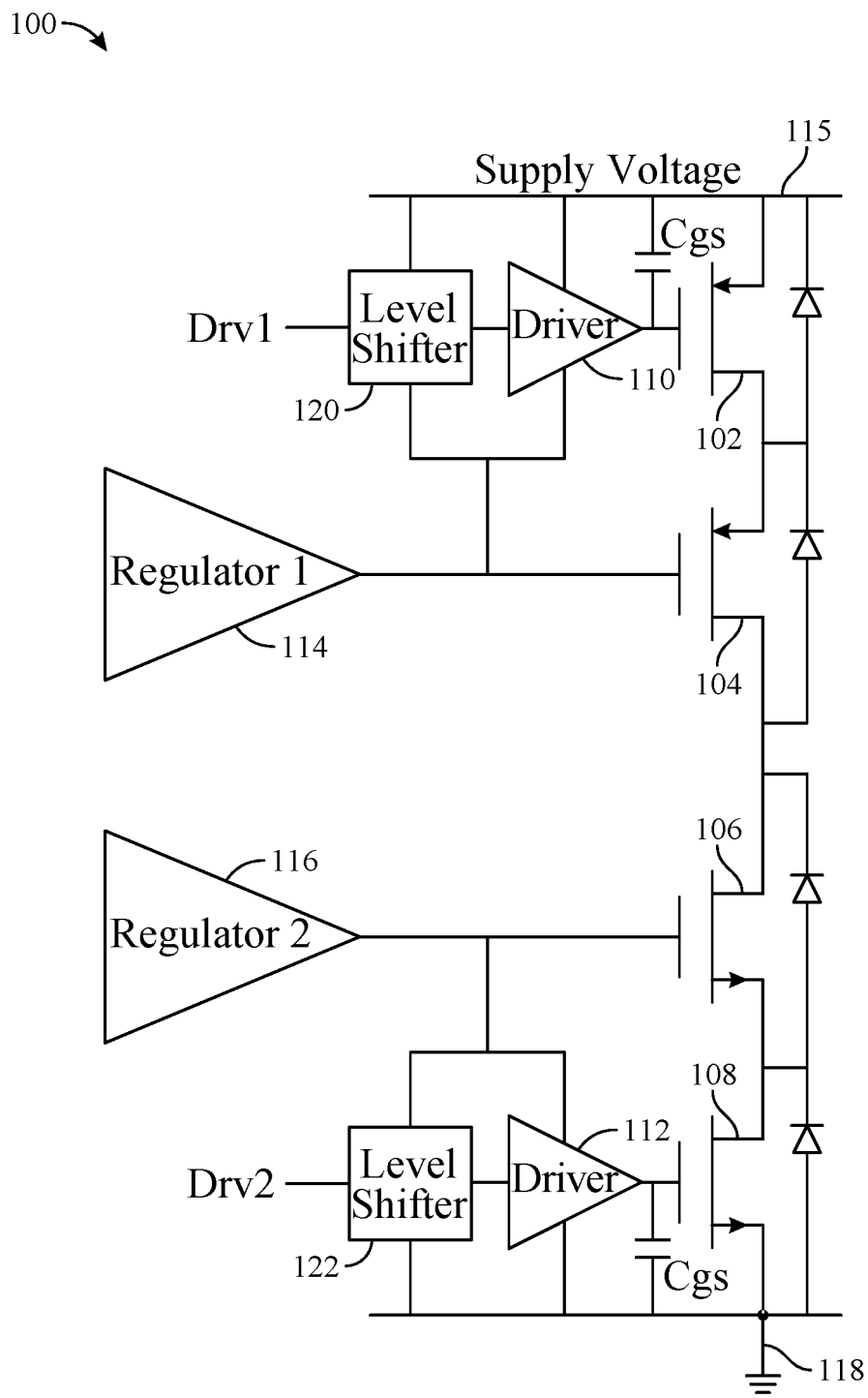
FIG. 1 illustrates a power stage, in accordance with certain aspects of the present disclosure.

FIG. 1 illustrates an example power stage 100 having p-type FETs (PFETs) 102, 104 and n-type FETs (NFETs) 106, 108, in accordance with certain aspects of the present disclosure. As shown in FIG. 1, a source of the PFET 102 is coupled to a voltage rail 115 having a supply voltage, a source of the PFET 104 is coupled to a drain of the PFET 102, a drain of the NFET 106 is coupled to a drain of the PFET 104, a drain of the NFET 108 is coupled to a source of the NFET 106, and a source of the NFET 108 is coupled to electric ground 118 (a reference potential node for the power stage 100).

As illustrated, a driver 110 may be used to drive the gate of the PFET 102, and a driver 112 may drive the gate of the NFET 108. For example, the driver 110 may provide the supply voltage at the voltage rail 115 to the gate of the PFET 102 to turn off the PFET 102, which has a source coupled to the voltage rail 115. The output of a regulator 114 may be coupled to a supply input of the driver 110, and the driver 110 may provide a voltage at the output of the regulator 114 to the gate of the PFET 102 to turn on the PFET 102. That is, the driver 110 may charge Cgs of the PFET 102 to turn on the PFET 102. Similarly, the driver 112 may electrically couple the electric ground 118 to the gate of the NFET 108 to turn off the NFET 108 and electrically couple the output of a regulator 116 to the gate of the NFET 108 to turn on the NFET 108. That is, the driver 112 may charge the Cgs of NFET 108 to turn on the NFET 108. In some cases, the regulators 114, 116 may be used to drive gates of respective PFET 104 and NFET 106. As illustrated, level shifters 120, 122 may be used to level shift respective drive voltages Drv1, Drv2. The level-shifted drive voltages at the outputs of the level shifters 120, 122 may be used to control the drivers 110, 112.

Figure 2:
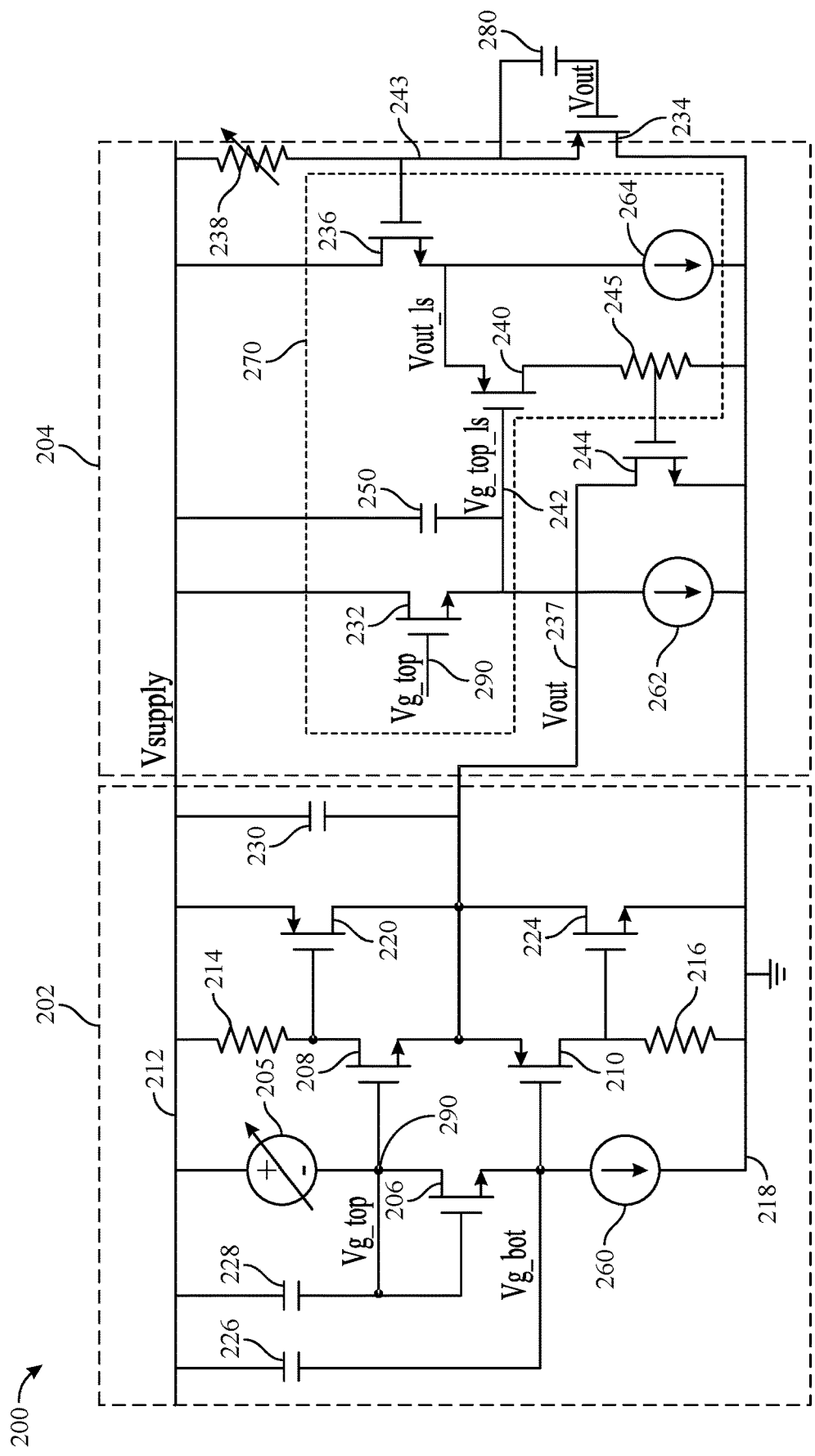
FIG. 2 illustrates a regulator of the power stage of FIG. 1, in accordance with certain aspects of the present disclosure.

FIG. 2 illustrates an example implementation of a regulator 200, in accordance with certain aspects of the present disclosure. The regulator 200 may correspond to the regulator 114 or regulator 116 of FIG. 1. The regulator 200 may include a source follower circuit 202 for generating the output voltage Vout of the regulator 200. In some aspects, the source follower circuit 202 may be implemented as a super source follower. The source follower circuit 202 alone may be unable to generate a rail-to-rail Vout (e.g., Vout may be unable to go as low as 0 V (e.g., electric ground potential)). In certain aspects, a low voltage assist circuit 204 may be used to allow for Vout to go as low as 0 V, as described in more detail herein, and thereby provide a rail-to-rail Vout at the output of the regulator 200.

As illustrated, the source follower circuit 202 may include a programmable voltage bias 205 (e.g., represented by a voltage source in FIG. 2) that may be used to set the voltage Vg_top (also referred to as a "control voltage") at the gates of NFETs 206, 208. For instance, the programmable voltage bias 205 may be a variable voltage source that may be controlled to set Vg_top. The gates of the NFETs 206, 208 may form a control input node 290 of the source follower circuit 202. The positive terminal of voltage source representing the programmable voltage bias 205 may be coupled to a supply node 212, and the negative terminal of the voltage source representing the programmable voltage bias 205 may be coupled to the control input node 290.

In certain implementations, the voltage Vg_top may be set to Vsupply−2.5 V if the programmable voltage bias 205 is set to 2.5 V, where Vsupply is the power supply voltage of the supply node 212. The NFET 206 may be configured as a diode-connected transistor. For example, the gate and drain of the NFET 206 may be electrically shorted. Thus, voltage Vg_bot at the source of the NFET 206 may be equal to Vg_top−Vgsn, where Vgsn is the gate-to-source voltage of the NFET 206.

As illustrated, the source of the NFET 206 may be coupled to a gate of a PFET 210. Therefore, the output voltage Vout at output node 237 may be equal to Vg_top−Vgsn+Vgsp, where Vgsp is the gate-to-source voltage of the PFET 210. Thus, if Vgsn and Vgsp are designed to be about the same, Vout may be about equal to Vg_top. However, with the source follower circuit alone, Vout may not be able to go below the threshold voltage of the PFET 210. For instance, if the threshold voltage of the PFET 210 is 1 V, Vout would not go below 1 V, even if Vg_top is set to a voltage below 1 V.

In certain aspects, a resistive element 214 may be coupled between a drain of the NFET 208 and supply node 212, and a resistive element 216 may be coupled between a drain of the PFET 210 and electric ground 218. The resistive elements 214, 216, together with NFET 208 and PFET 210, set the gate voltages of PFET 220 and NFET 224 of the source follower circuit 202. A current bias 260 (e.g., represented by a current source in FIG. 2) may be coupled between the gate of the PFET 210 and electric ground. The PFET 220 and NFET 224 may be configured to reduce the output resistance of the source follower circuit 202 to implement a super source follower. For example, if Vout decreases, the drain-to-source current of the NFET 208 may increase, resulting in an increase of the gate-to-source voltage of the PFET 220. Therefore, the source-to-drain current of the PFET 220 also increases, in effect reducing the output resistance of the source follower circuit 202.

In certain aspects, the source follower circuit 202 may include a capacitive element 226 coupled between the supply node 212 and a gate of the PFET 210, a capacitive element 228 between the supply node 212 and the gate of the NFET 206, and a capacitive element 230 between the supply node 212 and the output node 237. The capacitive elements 226, 228, 230 allow Vg_bot, Vg_top, and Vout, respectively, to track Vsupply.

As described herein, a low voltage assist circuit 204 may be used to allow for Vout to go as low as 0 V. For example, the low voltage assist circuit 204 may include a voltage comparison circuit 270 configured to compare a level-shifted version of Vout (Vout 1s) with Vg_top, and adjust Vout accordingly. As illustrated, the voltage comparison circuit 270 may include an NFET 232. In certain aspects, the gate of the NFET 232 may be coupled to the control input node 290, such that Vg_top is provided to the gate of NFET 232, forming a first input of the voltage comparison circuit 270.

The voltage Vg_top_ls at the source of the NFET 232 may be a level-shifted (ls) version of Vg_top (e.g., voltage level-shifted based on the threshold voltage of the NFET 232). However, the NFET 232 may be a low threshold voltage device. Therefore, Vg_top_ls may be about equal to Vg_top due to the low threshold voltage associated with the NFET 232.

As illustrated, the low voltage assist circuit 204 may also include a PFET 234. The gate of the PFET 234 may be coupled to the output node 237 (e.g., providing Vout). Thus, the voltage at the source of the PFET 234 may be equal to Vout plus Vgsp, Vgsp being the gate-to-source voltage of the PFET 234.

The voltage comparison circuit 270 may have a second input (e.g., at node 243) coupled to a source of the PFET 234. The low voltage assist circuit 204 may include a resistive element 238 (e.g., variable resistive element) coupled between the supply node 212 and the source of the PFET 234 to facilitate biasing of an NFET 236 of the voltage comparison circuit 270. As illustrated, a gate of the NFET 236 may be coupled to the source of the PFET 234. A bias current source 264 may be coupled between the source of the NFET 236 and electric ground. The NFET 236 of the voltage comparison circuit 270 may be a low threshold voltage transistor. In some aspects, the NFET 232 and the NFET 236 may be similar (e.g., have the same threshold voltage). Therefore, the voltage at the source of the NFET 236 may be about equal to the voltage at the source of the PFET 234 (gate of the NFET 236). In other words, the voltage at the source of the NFET 236 may be about equal to a level-shifted version of Vout (Vout 1s). Vout may be about equal to:

$$Vg\_top-Vgsn+Vgsp \approx Vg\_top$$

where Vgsn is the gate-to-source voltage of the NFET 206, and Vgsp is the gate-to-source voltage of the PFET 210. Thus, Vout_ls may be about equal to:

$$Vg\_top-Vgsn+(2 \times Vgsp) \approx Vout+Vgsp$$

where Vgsp is the gate-to-source voltage of the PFET 210 or the PFET 234, the gate-to-source voltage of the PFET 210 and the PFET 234 being configured to be about the same.

A PFET 240 of the voltage comparison circuit 270 may have a gate coupled to a node 242 being provided Vg_top_ls and coupled to the source of the NFET 232 and may have a source coupled to the source of the NFET 236 being provided Vout_ls. A bias current source 262 may be coupled between the node 242 and electric ground 218. The drain of the PFET 240 may be coupled to a resistive element 245 of the voltage comparison circuit 270 for generating a voltage at a gate of an NFET 244, having a drain coupled to output node 237 and having a source coupled to electric ground. In other words, the PFET 240 of voltage comparison circuit 270 compares Vg_top_ls (e.g., about equal to Vg_top) and Vout_ls and controls the NFET 244 such that Vout_ls– Vg_top is less than or equal to Vgsp. That is, the NFET 244 allows for Vout to be about as low as 0 V (electric ground) by controlling the NFET 244 to pull down Vout as the voltage difference between Vg_top and Vout_ls increases. In other words, Vout may not track Vg_top if Vg_top decreases below the threshold voltage of the PFET 210. Thus, the voltage comparison circuit 270 detects an increasing voltage difference between Vg_top and Vout_ls, and drives the NFET 244 to pull down Vout, facilitating rail-to-rail voltage regulation.

In certain aspects, the gate of the NFET 244 may be coupled to a tap of the resistive element 245. For example, the resistive element 245 may be implemented as a potentiometer. Thus, the voltage at the gate of the NFET 244 may be adjusted by setting the potentiometer to control how strongly the NFET 244 is to be driven to pull down Vout. In certain aspects, a capacitive element 250 may be coupled between the node 242 and the supply node 212 for filtering. Moreover, a capacitive element 280 may be coupled between the gate of the PFET 234 and the source of the PFET 234.

The regulator 200 is implemented with an open loop configuration with inherent source follower feedback. For example, as the source voltage (Vout) of the NFET 208 decreases (e.g., increasing gate-to-source voltage of NFET 208), the drain-to-source current of NFET 208 increases, facilitating the charging of output capacitance of the source follower and resulting in faster settling of the source follower output. The regulator 200 also provides low (e.g., about 0) quiescent current with fast transient response. The regulator 200 may be implemented with low output capacitance (e.g., about 200 pF). As described herein, the output voltage of the regulator 200 may go as low as 0 V, improving the efficiency of the power stage 100 as compared to conventional implementations.

Figure 3:
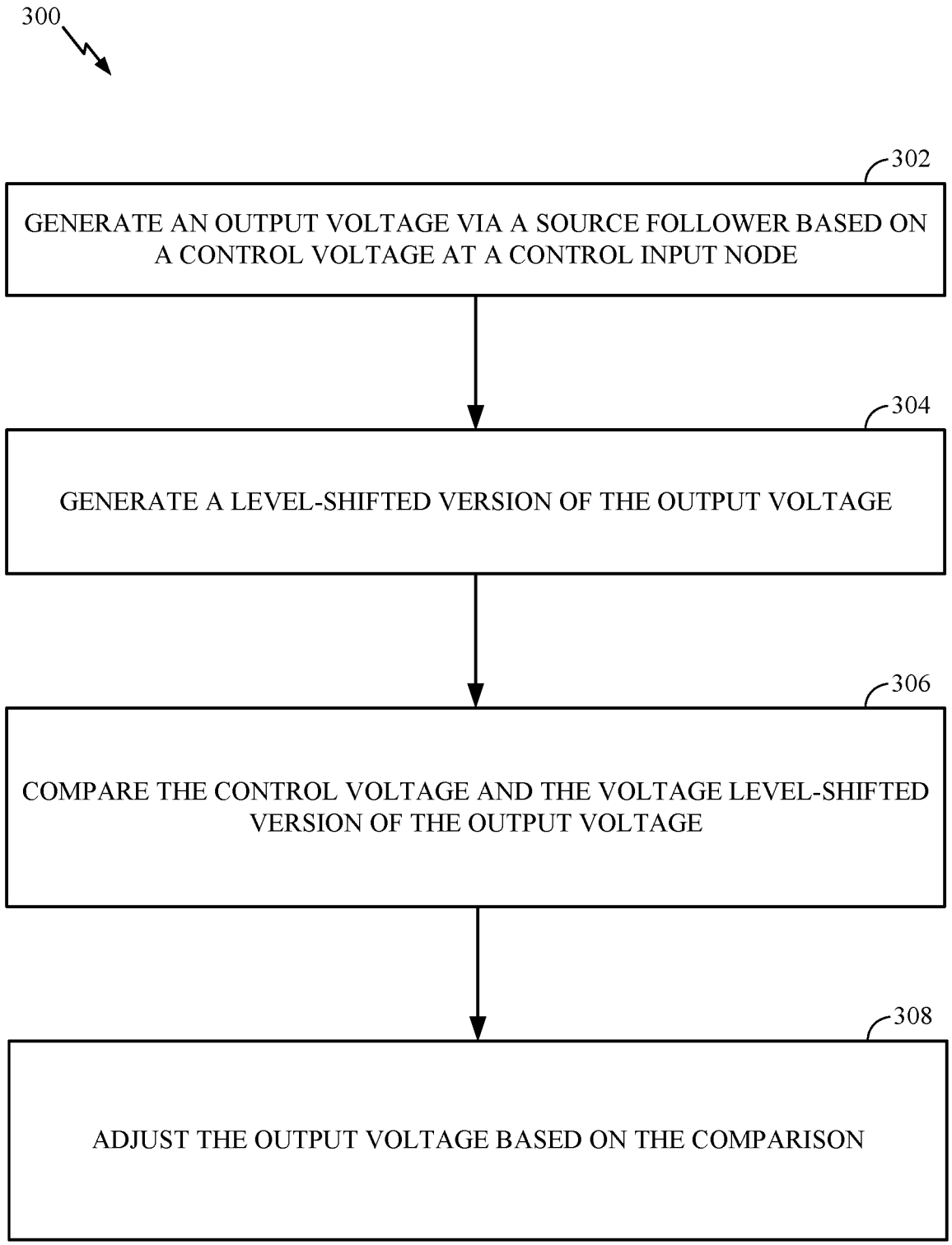
FIG. 3 is a flow diagram of example operations for voltage regulation, in accordance with certain aspects of the present disclosure.

FIG. 3 is a flow diagram of example operations 300 for voltage regulation, in accordance with certain aspects of the present disclosure. The operations 300 may be performed by a regulator, such as the regulator 200.

The operations 300 begin, at block 302, with the regulator generating an output voltage (e.g., Vout) via a source follower (e.g., source follower circuit 202) based on a control voltage at a control input node (e.g., control input node 290), and at block 304, generating a level-shifted version of the output voltage (e.g., Vout 1s). At block 306, the regulator may compare (e.g., via the voltage comparison circuit 270) the control voltage and the level-shifted version of the output voltage, and at block 308, adjust the output voltage based on the comparison. For example, adjusting the output voltage may include reducing the output voltage. In certain aspects, the output voltage may be at an output node (e.g., output node 237) of the regulator, and reducing the output voltage may involve sinking (e.g., via NFET 244) a current from the output node of the regulator. In certain aspects, comparing the control voltage and the level-shifted version of the output voltage may include comparing a level-shifted version of the control voltage (e.g., Vg_top_ls) and the level-shifted version of the output voltage.

Some aspects of the present disclosure are directed to a regulator (e.g., regulator 200). The regulator may include a source follower circuit (e.g., source follower circuit 202) and a low-voltage assist circuit (e.g., low-voltage assist circuit 204). The low-voltage assist circuit may include: a first transistor (e.g., PFET 234) having a gate coupled to an output node (e.g., output node 237) of the source follower circuit; a voltage comparison circuit (e.g., voltage comparison circuit 270) having a first input (e.g., at node 243) coupled to a source of the first transistor and a second input coupled to a control input node (e.g., control input node 290) of the source follower circuit; and a second transistor (e.g., NFET 244) having a gate coupled to an output of the voltage comparison circuit and having a drain coupled to the output node of the source follower circuit.

In some aspects, the voltage comparison circuit may further include a third transistor (e.g., PFET 240) having a source coupled to a source of the first transistor, a gate coupled to the control input node of the source follower circuit, and a drain coupled to the gate of the second transistor. In some aspects, the voltage comparison circuit may further include a fourth transistor (e.g., NFET 236) having a source coupled to the source of the third transistor and having a gate coupled to the source of the first transistor. In some aspects, the voltage comparison circuit may further include a resistive element (e.g., resistive element 245) coupled to the drain of the third transistor, the gate of the second transistor being coupled to the resistive element. In some aspects, the gate of the second transistor is coupled to a tap of the resistive element. In certain aspects, the voltage comparison circuit may further include a fourth transistor (e.g., NFET 232) having a gate coupled to the control input node and a source coupled to the gate of the third transistor.

In certain aspects, the source follower circuit may include a diode (e.g., a diode-connected transistor, such as NFET 206) and a third transistor (e.g., PFET 210), the diode being coupled between a gate of the third transistor and the control input node. A source of the third transistor may be coupled to the output node of the source follower circuit. In some aspects, the source follower circuit may further include a fourth transistor (e.g., NFET 224) having a gate coupled to a drain of the third transistor and a drain coupled to the output node, and a resistive element (e.g., resistive element 216) coupled between the drain of the third transistor and electric ground. In some aspects, the source follower circuit may further include: a fourth transistor (e.g., NFET 208) having a gate coupled to the control input node and a source coupled to the output node; a fifth transistor (e.g., PFET 220) having a gate coupled to a drain of the fourth transistor; and a resistive element (e.g., resistive element 214) coupled between the drain of the fourth transistor and a supply node.

Some aspects provide a power stage (e.g., power stage 100) having the regulator (e.g., regulator 200). The power stage may further include a third transistor (e.g., NFET 108) and a driver (e.g., driver 112) having an output coupled to a gate of the third transistor, where the output node of the regulator is coupled to a supply input of the driver. In some aspects, the source follower circuit may be a super source follower.

Example Aspects

Aspect 1. A regulator comprising: a source follower circuit; and a low-voltage assist circuit comprising: a first transistor having a gate coupled to an output node of the source follower circuit; a voltage comparison circuit having a first input coupled to a source of the first transistor and a second input coupled to a control input node of the source follower circuit; and a second transistor having a gate coupled to an output of the voltage comparison circuit and having a drain coupled to the output node of the source follower circuit.

Aspect 2. The regulator of aspect 1, wherein the voltage comparison circuit further comprises a third transistor having a source coupled to the source of the first transistor, a gate coupled to the control input node of the source follower circuit, and a drain coupled to the gate of the second transistor.

Aspect 3. The regulator of aspect 2, wherein the voltage comparison circuit further comprises a fourth transistor having a source coupled to the source of the third transistor and having a gate coupled to the source of the first transistor.

Aspect 4. The regulator of one of aspects 2-3, wherein the voltage comparison circuit further comprises a resistive element coupled to the drain of the third transistor, the gate of the second transistor being coupled to the resistive element.

Aspect 5. The regulator of aspect 4, wherein the gate of the second transistor is coupled to a tap of the resistive element.

Aspect 6. The regulator of one of aspects 2-5, wherein the voltage comparison circuit further comprises a fourth transistor having a gate coupled to the control input node and having a source coupled to the gate of the third transistor.

Aspect 7. The regulator of one of aspects 1-6, wherein the source follower circuit comprises: a diode; and a third transistor, the diode being coupled between a gate of the third transistor and the control input node, wherein a source of the third transistor is coupled to the output node of the source follower circuit.

Aspect 8. The regulator of aspect 7, wherein the diode comprises a diode-connected transistor.

Aspect 9. The regulator of one of aspects 7-8, wherein the source follower circuit further comprises: a fourth transistor having a gate coupled to a drain of the third transistor and having a drain coupled to the output node; and a resistive element coupled between the drain of the third transistor and an electric ground.

Aspect 10. The regulator of one of aspects 7-9, wherein the source follower circuit further comprises: a fourth transistor having a gate coupled to the control input node and having a source coupled to the output node; a fifth transistor having a gate coupled to a drain of the fourth transistor and having a drain coupled to the output node; and a resistive element coupled between the drain of the fourth transistor and a supply node.

Aspect 11. A power stage comprising the regulator of one of aspects 1-10, the power stage further comprising a third transistor and a driver having an output coupled to a gate of the third transistor, wherein the output node of the regulator is coupled to a supply input of the driver.

Aspect 12. The regulator of one of aspects 1-11, wherein the source follower circuit comprises a super source follower.

Aspect 13. A method for voltage regulation, comprising: generating an output voltage via a source follower based on a control voltage at a control input node; generating a level-shifted version of the output voltage; comparing the control voltage and the level-shifted version of the output voltage; and adjusting the output voltage based on the comparison.

Aspect 14. The method of aspect 13, wherein adjusting the output voltage comprises reducing the output voltage.

Aspect 15. The method of aspect 14, wherein the output voltage is at an output node of a regulator, and wherein reducing the output voltage comprises sinking a current from the output node of the regulator.

Aspect 16. The method of one of aspects 13-14, further comprising generating a level-shifted version of the control voltage, wherein comparing the control voltage and the level-shifted version of the output voltage comprises comparing the level-shifted version of the control voltage and the level-shifted version of the output voltage.

Aspect 17. The method of one of aspects 13-16, wherein the source follower comprises a super source follower.

Aspect 18. An apparatus for voltage regulation, comprising: means for generating an output voltage based on a control voltage at a control input node; means for generating a level-shifted version of the output voltage; means for comparing the control voltage and the level-shifted version of the output voltage; and means for adjusting the output voltage based on the comparison.

Aspect 19. The apparatus of aspect 18, wherein the means for adjusting the output voltage comprises means for reducing the output voltage.

Aspect 20. The apparatus of aspect 19, wherein the output voltage is at an output node of the apparatus, and wherein the means for reducing the output voltage comprises means for sinking a current from the output node of the apparatus.

Aspect 21. The apparatus of one of aspects 18-20, further comprising means for generating a level-shifted version of the control voltage, wherein the means for comparing comprises means for comparing the level-shifted version of the control voltage and the level-shifted version of the output voltage.

The various operations or methods described above may be performed by any suitable means capable of performing the corresponding functions. The means may include various hardware and/or software component(s) and/or module (s), including, but not limited to a circuit, an application specific integrated circuit (ASIC), or processor. Generally, where there are operations illustrated in figures, those operations may have corresponding counterpart means-plus-function components with similar numbering. In certain aspects, means for generating may comprise a source follower, such as the source follower circuit 202, or a transistor, such as the PFET 234. Means for comparing may comprise a voltage comparison circuit, such as the voltage comparison circuit 270. Means for adjusting and means for reducing may comprise a transistor, such as the NFET 244.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

What is claimed is:

1. A regulator comprising:
   a source follower circuit; and
   a low-voltage assist circuit comprising:
      a first transistor having a gate coupled to an output node of the source follower circuit;
      a voltage comparison circuit having a first input coupled to a source of the first transistor and a second input coupled to a control input node of the source follower circuit; and
      a second transistor having a gate coupled to an output of the voltage comparison circuit and having a drain coupled to the output node of the source follower circuit.

2. The regulator of claim 1, wherein the voltage comparison circuit further comprises a third transistor having a source coupled to the source of the first transistor, a gate coupled to the control input node of the source follower circuit, and a drain coupled to the gate of the second transistor.

3. The regulator of claim 2, wherein the voltage comparison circuit further comprises a fourth transistor having a source coupled to the source of the third transistor and having a gate coupled to the source of the first transistor.

4. The regulator of claim 2, wherein the voltage comparison circuit further comprises a resistive element coupled to the drain of the third transistor, the gate of the second transistor being coupled to the resistive element.

5. The regulator of claim 4, wherein the gate of the second transistor is coupled to a tap of the resistive element.

6. The regulator of claim 2, wherein the voltage comparison circuit further comprises a fourth transistor having a gate coupled to the control input node and having a source coupled to the gate of the third transistor.

7. The regulator of claim 1, wherein the source follower circuit comprises:
   a diode; and
   a third transistor, the diode being coupled between a gate of the third transistor and the control input node, wherein a source of the third transistor is coupled to the output node of the source follower circuit.

8. The regulator of claim 7, wherein the diode comprises a diode-connected transistor.

9. The regulator of claim 7, wherein the source follower circuit further comprises:
   a fourth transistor having a gate coupled to a drain of the third transistor and having a drain coupled to the output node; and
   a resistive element coupled between the drain of the third transistor and an electric ground.

10. The regulator of claim 7, wherein the source follower circuit further comprises:
    a fourth transistor having a gate coupled to the control input node and having a source coupled to the output node;
    a fifth transistor having a gate coupled to a drain of the fourth transistor and having a drain coupled to the output node; and a resistive element coupled between the drain of the fourth transistor and a supply node.

11. A power stage comprising the regulator of claim 1, the power stage further comprising a third transistor and a driver having an output coupled to a gate of the third transistor, wherein the output node of the regulator is coupled to a supply input of the driver.

12. The regulator of claim 1, wherein the source follower circuit comprises a super source follower.

13. A method for voltage regulation, comprising:
   generating an output voltage via a source follower based on a control voltage at a control input node;
   generating a level-shifted version of the output voltage;
   comparing the control voltage and the level-shifted version of the output voltage; and
   adjusting the output voltage based on the comparison.

14. The method of claim 13, wherein adjusting the output voltage comprises reducing the output voltage.

15. The method of claim 14, wherein the output voltage is at an output node of a regulator, and wherein reducing the output voltage comprises sinking a current from the output node of the regulator.

16. The method of claim 13, further comprising generating a level-shifted version of the control voltage, wherein comparing the control voltage and the level-shifted version of the output voltage comprises comparing the level-shifted version of the control voltage and the level-shifted version of the output voltage.

17. The method of claim 13, wherein the source follower comprises a super source follower.

18. An apparatus for voltage regulation, comprising:
   means for generating an output voltage based on a control voltage at a control input node;
   means for generating a level-shifted version of the output voltage;
   means for comparing the control voltage and the level-shifted version of the output voltage; and
   means for adjusting the output voltage based on the comparison.

19. The apparatus of claim 18, wherein the means for adjusting the output voltage comprises means for reducing the output voltage.

20. The apparatus of claim 19, wherein the output voltage is at an output node of the apparatus, and wherein the means for reducing the output voltage comprises means for sinking a current from the output node of the apparatus.

21. The apparatus of claim 18, further comprising means for generating a level-shifted version of the control voltage, wherein the means for comparing comprises means for comparing the level-shifted version of the control voltage and the level-shifted version of the output voltage.

\* \* \* \* \*